(12) United States Patent
Wu

(10) Patent No.: US 8,937,566 B2
(45) Date of Patent: Jan. 20, 2015

(54) SYSTEM AND METHOD FOR MANAGING DIGITAL/ANALOG CONVERTOR OF A VIDEO CARD

(71) Applicant: Hon Hai Precision Industry Co., Ltd., New Taipei (TW)

(72) Inventor: Chih-Huang Wu, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/869,766

(22) Filed: Apr. 24, 2013

(65) Prior Publication Data

US 2014/0002671 A1 Jan. 2, 2014

(30) Foreign Application Priority Data

Jun. 27, 2012 (TW) .............................. 101122902 A

(51) Int. Cl.
*H03M 1/66* (2006.01)
*H04N 17/00* (2006.01)
*G06F 3/14* (2006.01)
*H03M 1/10* (2006.01)

(52) U.S. Cl.
CPC ............ *H04N 17/004* (2013.01); *H03M 1/662* (2013.01); *H03M 1/1071* (2013.01); *G06F 3/14* (2013.01)

USPC ........................................................ 341/141

(58) Field of Classification Search
CPC ...... H03M 1/662; H03M 1/10; H03M 1/1004; H03M 1/1071; H03M 1/1076
USPC ........................................................ 341/141
See application file for complete search history.

(56) References Cited

U.S. PATENT DOCUMENTS

2009/0085782 A1* 4/2009 Felder et al. ................... 341/144
2011/0001765 A1* 1/2011 Hyodo et al. ................... 341/141

FOREIGN PATENT DOCUMENTS

JP 08278771 A * 10/1996

* cited by examiner

*Primary Examiner* — Howard Williams
(74) *Attorney, Agent, or Firm* — Novak Druce Connolly Bove + Quigg LLP

(57) ABSTRACT

In a method of processing an abnormal digital/analog convertor (DAC) of a video card, the video card comprising a first DAC and a second DAC, the video card connecting to an output interface. The method controls the video card to use the first DAC for converting data to the output interface through a first switch and at least one second switches in the video card. The method further detects whether the first DAC works normally. When the first DAC is determined to work abnormally, the method switches the first DAC to the second DAC for converting the data to the output interface through the first switch and the at least one second switches.

15 Claims, 5 Drawing Sheets

__US 8,937,566 B2__

SYSTEM AND METHOD FOR MANAGING DIGITAL/ANALOG CONVERTOR OF A VIDEO CARD

BACKGROUND

1. Technical Field

Embodiments of the present disclosure relate to data process technology, and particularly to a system and a method for managing digital/analog convertors (DAC) of a video card.

2. Description of Related Art

A computing device employs a video card (e.g. video graphics array (VGA)) card and an output connector to connect the computing device to an external device (e.g. a cathode ray tube (CRT) display), for displaying a picture. However, because the video card is an output port to connect to the external device, the video card may be destroyed or affected by the external device. For example, an electrostatic discharge (ESD) or an abnormal external device may bring a high voltage or a high current to the video card, and a digital/analog convertor (DAC) in the video card may be damaged. Once the DAC is damaged, the pictures may be displayed abnormally. For example, color may be lacking in a RGB color model. The video card has to be discarded. It is inconvenient and wasteful.

DETAILED DESCRIPTION

The disclosure, including the accompanying drawings, is illustrated by way of examples and not by way of limitation. It should be noted that references to "an" or "one" embodiment in this disclosure are not necessarily to the same embodiment, and such references mean "at least one."

In general, the word "module," as used herein, refers to logic embodied in hardware or firmware unit, or to a collection of software instructions, written in a programming language. One or more software instructions in the modules may be embedded in firmware unit, such as in an EPROM. The modules described herein may be implemented as either software and/or hardware modules and may be stored in any type of non-transitory computer-readable medium or other storage device. Some non-limiting examples of non-transitory computer-readable media may include CDs, DVDs, BLU-RAY, flash memory, and hard disk drives.

Figure 1:
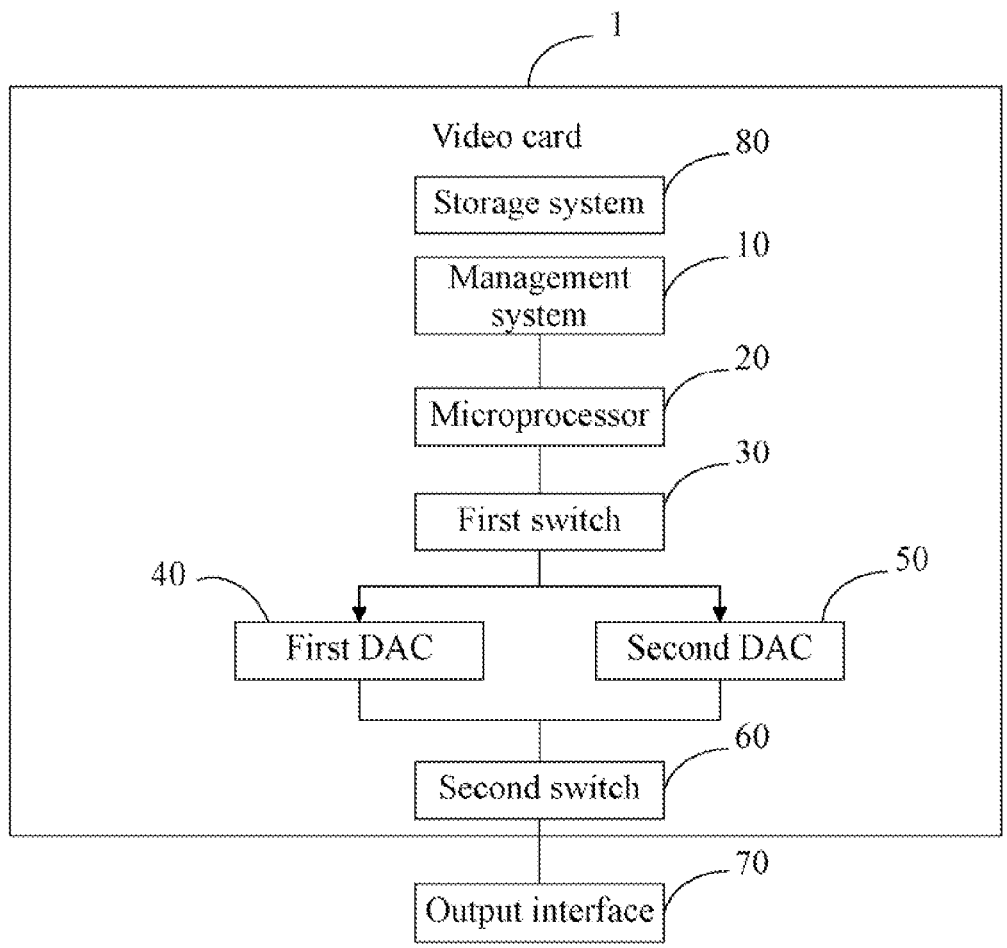
FIG. 1 is a block diagram of one embodiment of a video card including a management system.

FIG. 1 is a block diagram of one embodiment of a video card 1. The video card 1 includes a management system 10, a microprocessor 20, a first switch 30, a first digital/analog convertor (DAC) 40, a second DAC 50, and a second switch 60. The microprocessor 20 connects to the first DAC 40 and the second DAC 50 through the first switch 30. The first DAC 40 and the second DAC 50 converts digital signals of the video card 1 into analog signals. The microprocessor 20 enables one of the first DAC 40 and the second DAC 50 using the first switch 30, and controls the video card 1 to work using the enabled DAC. The first DAC 40 and the second DAC 50 are both connected to the second switch 60. The video card 1 connects to an output interface 70 for outputting data to an analog display (e.g. a CRT display) through the second switch 60. The management system 10 controls the video card 1 to work normally by switching between the first DAC 40 and the second DAC 50 when one of the first DAC 40 and the second DAC 50 is abnormal.

The microprocessor 20 further detects whether the first DAC 40 is normal. In one embodiment, the microprocessor 20 may send a signal to the first DAC 40 and wait for a response from the first DAC 40. If the microprocessor 2 receives the response from the first DAC 40 in a preset time duration, the first DAC 40 is determined to be normal. If the microprocessor 2 does not receive any response from the first DAC 40 in the preset time duration, the first DAC 40 is determined to be abnormal. In other embodiments, the microprocessor 2 may determine whether the first DAC 40 is normal by determining whether a voltage of a serial clock pin and a serial data line pin of the first DAC 40 is in a preset range.

The first switch 30 includes a first input port (denoted as "a1"), a first control port (denoted as "b1"), a first output port (denoted as "c1"), and a second output port (denoted as "c2"). In one embodiment, the first switch 30 may be high level effective. For example, if a first voltage level is output to the first control port "b1", the first switch 30 is switched on. If a second voltage level is output to the first control port "b1", the first switch 30 is switched off. In one embodiment, the first voltage level may be a high voltage that represents a logical "1". The second voltage level may be a low voltage that represents a logical "0". The high voltage may be 1V, and the low voltage may be 0V, for example. In other embodiments, the first switch 30 may be low level effective.

The second switch 60 includes a second input port (denoted as "a2"), a third input port (denoted as "a3"), a second control port (denoted as "b2"), a third output port (denoted as "c3"). In one embodiment, if the first voltage level is output to the second control port "b2", the second switch 14 controls the second input port "a2" to connect to the third output port "c3". If the second voltage level is output to the second control port "b2", the second switch 14 controls the third input port "a3" to connect to the third output port "c3".

Figure 2:
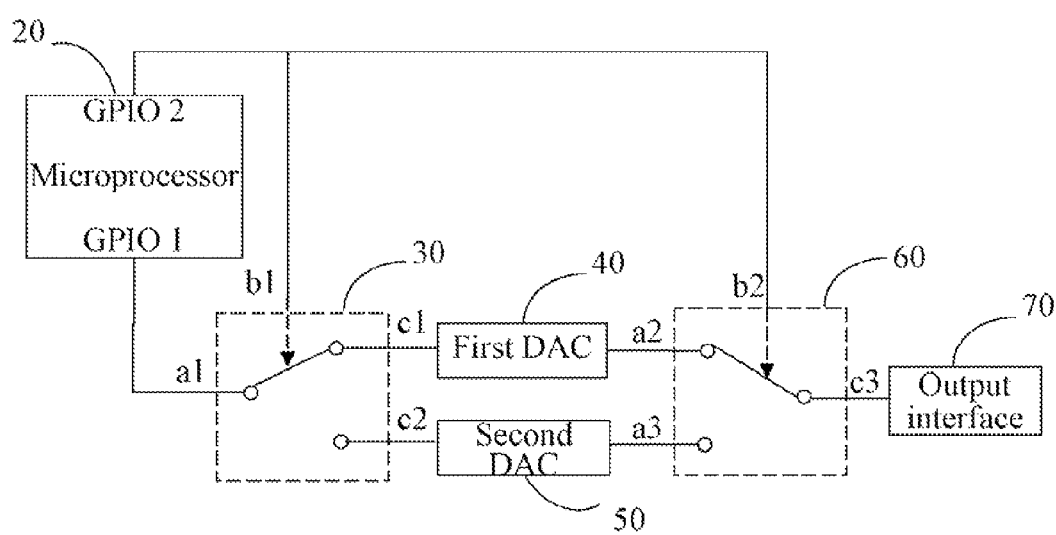
FIG. 2 illustrates one embodiment of a circuit of Digital/Analog Convertors in the video card in FIG. 1.

FIG. 2 illustrates one embodiment of a circuit of the first DAC 40 and the second DAC 50 in the video card 1 in FIG. 1. As shown in FIG. 2, the first input port "a1" connects to a first general-purpose input/output (GPIO) pin (e.g. GPIO 1 in FIG. 2) of the microprocessor 20, and the first control port "b1" connects to a second GPIO pin (e.g. GPIO 2 in FIG. 2) of the microprocessor 20. The first output port "c1" of the first switch 30 connects to an enable end of the first DAC 40 (not shown in FIG. 2), and the second output port "c2" connects to an enable end of the second DAC 50 (not shown in FIG. 2). The second input port "a2" of the second switch 60 connects to an output end of the first DAC 40 (not shown in FIG. 2), and the third input port "a3" connects to an output end of the second DAC 50 (not shown in FIG. 2). The second control port "b2" of the second switch 60 connects to the second GPIO pin of the microprocessor 20, and the third output port "c3" connects to the output interface 70.

In one embodiment, when the microprocessor 20 controls the second GPIO pin to output the first voltage level, the microprocessor 20 enables the first DAC 40, and the first DAC 40 outputs the analog signals to the output interface 70 through the second switch 60. When the microprocessor 20 controls the second GPIO pin to output the second voltage level, the microprocessor 20 enables the second DAC 50, and the second DAC 40 outputs the analog signals to the output interface 70 through the second switch 60.

Figure 3:
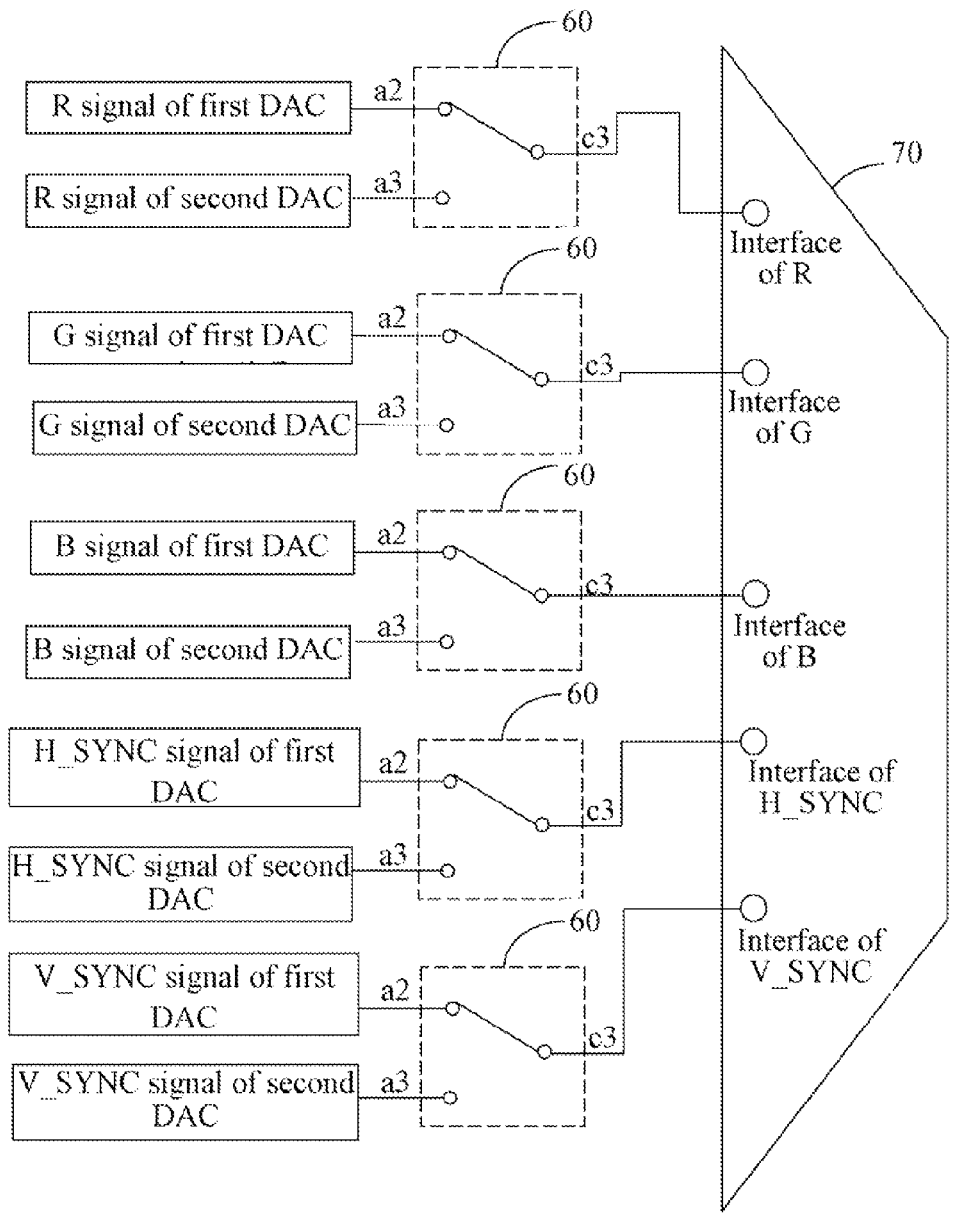
FIG. 3 illustrates one embodiment of the DAC connecting to a second switch in video card in FIG. 1.

In some embodiments, both of the first DAC 40 and the second DAC 50 output a RGB tricolor signal, a H_SYNC signal, and a V_SYNC signal to the output interface 70. Therefore, a plurality of second switches 60 may be used. When the second input port "a2" of each of the second switches 60 connects to a signal output end of the first DAC 40 corresponding to an signal interface of the output interface 70, the third input port "a3" of each of the second switches 60 connects to a same signal output end of the second DAC 50, and the third output port "c3" of each of the second switches 60 connects to the signal interface. For example, when an output end of R signal of the first DAC 40 connects to a second input port "a2" of one of the second switches 60, the third input port "a3" of the one of the second switches 60 connects to an output end of R signal of the second DAC 50, and the third output port "c3" connects to an interface of R signal of the output interface 70. FIG. 3 illustrates one embodiment of the plurality of second switches 60 in connection to the first DAC 40 and the second DAC 50.

Figure 4:
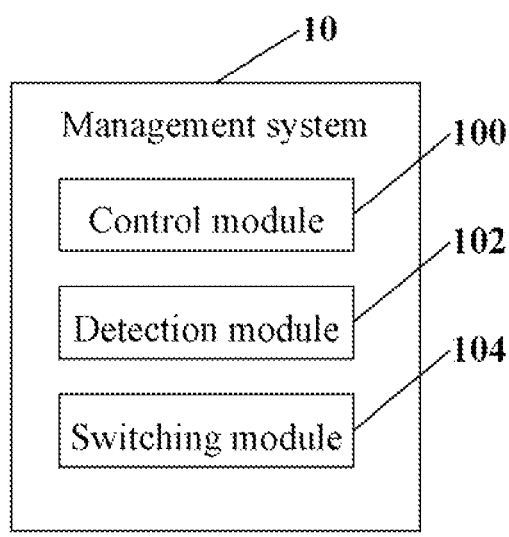
FIG. 4 is a block diagram of one embodiment of function modules of the management system in FIG. 1.
Figure 5:
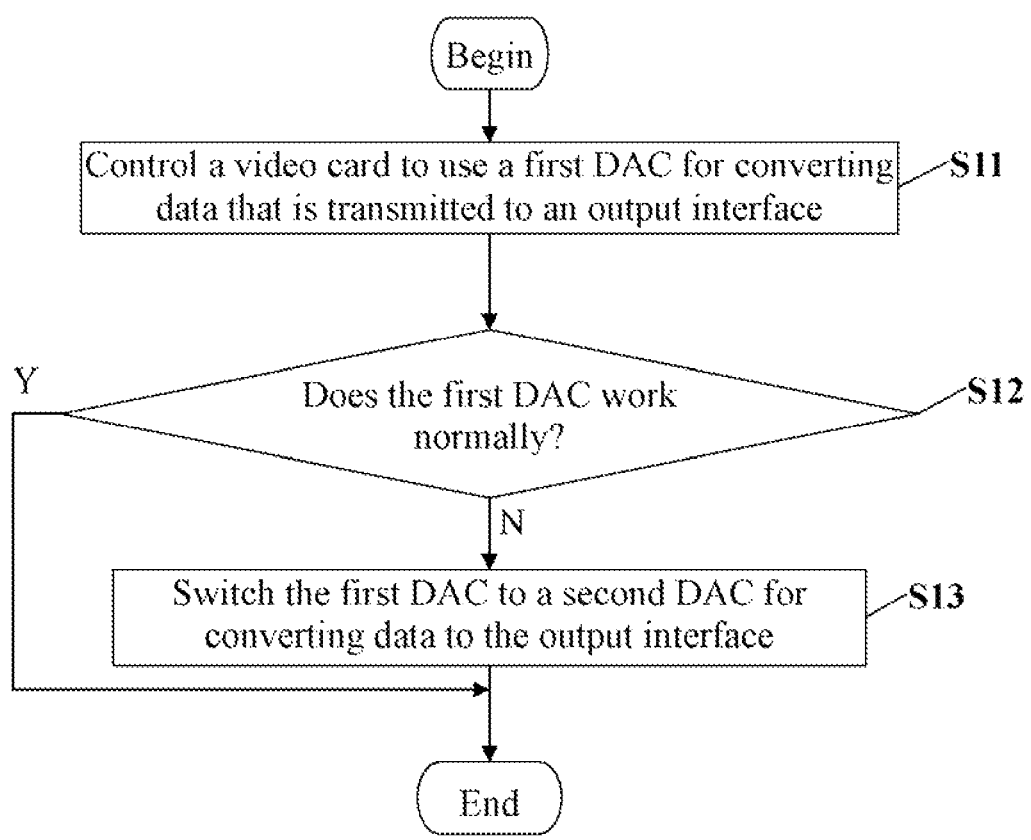
FIG. 5 is a flowchart illustrating one embodiment of a method for managing DACs in the video card of FIG. 1.

As shown in FIG. 4, the management system 10 includes a control module 100, a detection module 102, and a switching module 104. The modules 100, 102, and 104 comprise computerized codes in the form of one or more programs that are stored in the storage system 80. The computerized codes include instructions that are executed by the microprocessor 20 to provide functions for the modules. Details of each of the modules will be given.

The control module 100 controls the video card 1 to use the first DAC 40 for converting data that needs to be transmitted to the output interface 70. The video card 1 outputs analog data converted by the first DAC 40 to the output interface 70. In detail, the control module 100 controls the second GPIO pin of the microprocessor 20 to initially output the first voltage level to the first control port "b1" and the second control port "b2". The microprocessor 20 communicates with the output interface 70 through the first GPIO pin, the first input port "a1", the first output port "c1", the first DAC 40, the second input port "a2", and the third output port "c3".

The detection module 102 controls the microprocessor 20 to detect whether the first DAC 40 works normally. In one embodiment, the detection module 102 controls the microprocessor 20 to send a request signal at each predetermined time interval (e.g. 5 seconds) to the first DAC 40, and waits for a response from the first DAC 40. If the microprocessor 20 receives the response from the first DAC 40 in the preset time duration (e.g. 2 seconds), the detection module 102 determines that the first DAC 40 works normally. If the microprocessor 20 does not receive any response from the first DAC 40 in the preset time duration, the detection module 102 determines that the first DAC 40 works abnormally.

When the first DAC 40 is determined to work abnormally, the switch module 104 switches the first DAC 40 to the second DAC 50 for converting data to the output interface 70. The video card 1 outputs analog data converted by the second DAC 50 to the output interface 70. In detail, the control module 100 controls the second GPIO pin of the microprocessor 20 to initially output the second voltage level to the first control port "b1" and the second control port "b2". The microprocessor 20 communicates with the output interface 70 through the first GPIO pin, the first input port "a1", the second output port "c2", the second DAC 50, the third input port "a3", and the third output port "c3".

FIG. 3 is a flowchart illustrating a method for processing an abnormal DAC in the video card of FIG. 1. Depending on the embodiment, additional steps may be added, others removed, and the ordering of the steps may be changed.

In step S11, The control module 100 controls the video card 1 to use the first DAC 40 for converting data that needs to be transmitted to the output interface 70. The video card 1 outputs analog data converted by the first DAC 40 to the output interface 70. In detail, the control module 100 controls the second GPIO pin of the microprocessor 20 to initially output the first voltage level to the first control port "b1" and the second control port "b2". The microprocessor 20 communicates with the output interface 70 through the first GPIO pin, the first input port "a1", the first output port "c1", the first DAC 40, the second input port "a2", and the third output port "c3".

In step S12, The detection module 102 controls the microprocessor 20 to detect whether the first DAC 40 works normally. When the first DAC 40 is determined to work normally, procedure ends. When the first DAC 40 is determined to work abnormally, step S13 is implemented.

In step S13, the switch module 104 switches the first DAC 40 to use the second DAC 50 for converting data to the output interface 70. The video card 1 outputs analog data converted by the second DAC 50 to the output interface 70. In detail, the control module 100 controls the second GPIO pin of the microprocessor 20 to initially output the second voltage level to the first control port "b1" and the second control port "b2". The microprocessor 20 communicates with the output interface 70 through the first GPIO pin, the first input port "a1", the second output port "c2", the second DAC 50, the third input port "a3", and the third output port "c3".

All of the processes described above may be embodied in, and be fully automated via, functional code modules executed by one or more general-purpose processors. The code modules may be stored in any type of non-transitory readable medium or other storage device. Some or all of the methods may alternatively be embodied in specialized hardware. Depending on the embodiment, the non-transitory readable medium may be a hard disk drive, a compact disc, a digital video disc, a tape drive or other suitable storage medium.

The described embodiments are merely possible examples of implementations, and have been set forth for a clear understanding of the principles of the present disclosure. Many variations and modifications may be made without departing substantially from the spirit and principles of the present disclosure. All such modifications and variations are intended to be included herein within the scope of this disclosure and the described inventive embodiments, and the present disclosure is protected by the following claims.

What is claimed is:

1. A computer-implemented method for managing digital/analog convertors (DACs) of a video card, the video card comprising a first DAC and a second DAC, the video card in connection with an output interface, the computer-implemented method comprising:

controlling the video card to use the first DAC for converting data that is transmitted to the output interface through a first switch and at least one second switches in the video card;

detecting whether the first DAC works normally by sending a request signal at each predetermined time interval and waiting for a response from the first DAC, wherein the first DAC is determined to work normally when the response has been received from the first DAC in a preset time duration, and the first DAC is determined to work abnormally when the response has not been received from the first DAC in the preset time duration; and switching the first DAC to the second DAC for converting the data to the output interface through the first switch and the at least one second switches, when the first DAC works abnormally.

2. The computer-implemented method according to claim 1, wherein the first switch comprises:
a first input port that connects to a first general-purpose input/output (GPIO) pin of a microprocessor in the video card;
a first control port that connects to a second GPIO pin of the microprocessor;
a first output port that connects to an enable end of the first DAC;
a second output port that connects to an enable end of the second DAC;
and each of the at least one second switches comprises:
a second input port that connects to an output end of the first DAC;
a third input port that connects to an output end of the second DAC;
a second control port that connects to the second GPIO pin;
a third output port that connects to the output interface.

3. The computer-implemented method according to claim 2, wherein the video card is controlled to use the first DAC by controlling the second GPIO pin of the microprocessor to initially output a first voltage level to the first control port and the second control port, the microprocessor is connected to the output interface through the first GPIO pin, the first input port, the first output port, the first DAC, the second input port, and the third output port.

4. The computer-implemented method according to claim 2, wherein the video card is controlled to use the second DAC by controlling the second GPIO pin of the microprocessor to output a second voltage level to the first control port and the second control port, the microprocessor is connected to the output interface through the first GPIO pin, the first input port, the second output port, the second DAC, the third input port, and the third output port.

5. The computer-implemented method according to claim 2, wherein each of the first DAC and the second DAC comprises different types of signal output ends for outputting different signals to the output interface, and the second input port of each of the second switches connects to a specified signal output end of the first DAC, the third input port of each of the second switches connects to a same signal output end of the second DAC corresponding to the type of the specified signal output end, and the third output port of each of the second switches connects to a specified signal interface of the output interface corresponding to the type of the specified signal output end.

6. A non-transitory storage medium storing a set of instructions, when executed by at least one processor of a video card, cause the at least one processor to perform a method for managing digital/analog convertors (DAC) of a video card, the video card comprising a first DAC and a second DAC and the video card connecting to an output interface, the method comprising:
controlling the video card to use the first DAC for converting data that is transmitted to an output interface through a first switch and at least one second switches in the video card;
detecting whether the first DAC works normally by sending a request signal at each predetermined time interval and waiting for a response from the first DAC, wherein the first DAC is determined to work normally when the response has been received from the first DAC in a preset time duration, and the first DAC is determined to work abnormally when the response has not been received from the first DAC in the preset time duration; and
switching the first DAC to the second DAC for converting the data to the output interface through the first switch and the at least one second switches, when the first DAC is determined to work abnormally.

7. The non-transitory storage medium according to claim 6, wherein the first switch comprises:
a first input port that connects to a first general-purpose input/output (GPIO) pin of a microprocessor in the video card;
a first control port that connects to a second GPIO pin of the microprocessor;
a first output port that connects to an enable end of the first DAC;
a second output port that connects to an enable end of the second DAC;
and each of the at least one second switches comprises:
a second input port that connects to an output end of the first DAC;
a third input port that connects to an output end of the second DAC;
a second control port that connects to the second GPIO pin;
a third output port that connects to an output interface.

8. The non-transitory storage medium according to claim 7, wherein the video card is controlled to use the first DAC by controlling the second GPIO pin of the microprocessor to initially output a first voltage level to the first control port and the second control port, the microprocessor communicating with the output interface through the first GPIO pin, the first input port, the first output port, the first DAC, the second input port, and the third output port.

9. The non-transitory storage medium according to claim 7, wherein the video card is controlled to use the second DAC by controlling the second GPIO pin of the microprocessor to output a second voltage level to the first control port and the second control port, the microprocessor communicating with the output interface through the first GPIO pin, the first input port, the second output port, the second DAC, the third input port, and the third output port.

10. The non-transitory storage medium according to claim 7, wherein each of the first DAC and the second DAC comprises different types of signal output ends for outputting different signals to the output interface, and the second input port of each of the second switches connects to a specified signal output end of the first DAC, the third input port of each of the second switches connects to a same signal output end of the second DAC corresponding to the type of the specified signal output end, and the third output port of each of the second switches connects to a specified signal interface of the output interface corresponding to the type of the specified signal output end.

11. A video card connecting with an output interface, comprising:
a first switch; at least one second switches; a first digital/analog convertor (DAC) and a second DAC; a storage system; at least one processor for executing one or more programs that are stored in the storage system to perform a method of managing DACs:
controlling the video card to use the first DAC for converting data that is transmitted to an output interface through a first switch and at least one second switches;
detecting whether the first DAC works normally by sending a request signal at each predetermined time interval and waiting for a response from the first DAC, wherein the first DAC is determined to work normally when the response has been received from the first DAC in a preset time duration, and the first DAC is determined to work abnormally when the response has not been received from the first DAC in the preset time duration; and switching the first DAC to the second DAC for converting the data to the output interface through the first switch and the at least one second switches, when the first DAC is determined to work abnormally.

12. The video card according to claim 11, wherein the first switch comprises:

a first input port that connects to a first general-purpose input/output (GPIO) pin of a microprocessor in the video card;

a first control port that connects to a second GPIO pin of the microprocessor;

a first output port that connects to an enable end of the first DAC;

a second output port that connects to an enable end of the second DAC;

and each of the at least one second switches comprises:

a second input port that connects to an output end of the first DAC;

a third input port that connects to an output end of the second DAC;

a second control port that connects to the second GPIO pin;

a third output port that connects to the output interface.

13. The video card according to claim 12, wherein the video card is controlled to use the first DAC by controlling the second GPIO pin of the microprocessor to initially output a first voltage level to the first control port and the second control port, the microprocessor communicating with the output interface through the first GPIO pin, the first input port, the first output port, the first DAC, the second input port, and the third output port.

14. The video card according to claim 12, wherein the video card is controlled to use the second DAC by controlling the second GPIO pin of the microprocessor to output a second voltage level to the first control port and the second control port, the microprocessor communicating with the output interface through the first GPIO pin, the first input port, the second output port, the second DAC, the third input port, and the third output port.

15. The video card according to claim 12, wherein each of the first DAC and the second DAC comprises different types of signal output ends for outputting different signals to the output interface, and the second input port of each of the second switches connects to a specified signal output end of the first DAC, the third input port of each of the second switches connects to a same signal output end of the second DAC corresponding to the type of the specified signal output end, and the third output port of each of the second switches connects to a specified signal interface of the output interface corresponding to the type of the specified signal output end.

* * * * *